(12) United States Patent
Leary et al.

(10) Patent No.: US 10,168,392 B2
(45) Date of Patent: Jan. 1, 2019

(54) TUNABLE ANISOTROPY OF CO-BASED NANOCOMPOSITES FOR MAGNETIC FIELD SENSING AND INDUCTOR APPLICATIONS

(71) Applicant: Carnegie Mellon University, Pittsburgh, PA (US)

(72) Inventors: Alex M. Leary, Pittsburgh, PA (US); Paul R. Ohodnicki, Pittsburgh, PA (US); Michael E. McHenry, Pittsburgh, PA (US); Vladimir Keylin, Pittsburgh, PA (US); Joseph Huth, Pittsburgh, PA (US); Samuel J. Kernion, Pittsburgh, PA (US)

(73) Assignees: Carnegie Mellon University, Pittsburgh, PA (US); SPANG, INC., Pittsburgh, PA (US); U.S. Department of Energy, Washington, DC (US)

(*) Notice: Subject to any disclaimer, the term of this patent is extended or adjusted under 35 U.S.C. 154(b) by 307 days.

(21) Appl. No.: 14/278,836

(22) Filed: May 15, 2014

(65) Prior Publication Data
US 2014/0338793 A1    Nov. 20, 2014

Related U.S. Application Data

(60) Provisional application No. 61/855,439, filed on May 15, 2013.

(51) Int. Cl.
*G01R 33/02* (2006.01)
*H01F 1/153* (2006.01)
(Continued)

(52) U.S. Cl.
CPC ......... *G01R 33/02* (2013.01); *H01F 1/15333* (2013.01); *H01F 41/0226* (2013.01); *G01R 33/0052* (2013.01)

(58) Field of Classification Search
CPC ............... G01R 33/0052; G01R 33/02; H01F 1/15333; H01F 41/0226; H01F 1/147; C22C 19/07; C22F 1/10
See application file for complete search history.

(56) References Cited

U.S. PATENT DOCUMENTS

| 4,881,989 A | 11/1989 | Yoshizawa et al. |
| 5,935,347 A | 8/1999 | Suzuki et al. |

(Continued)

OTHER PUBLICATIONS

Peng, H.X. et al. "Co-based magnetic microwire and field-tunable multifunctional macro-composites" (2009) Journal of Non-Crystalline Solids. 355. 1380-1386.*

(Continued)

*Primary Examiner* — Colleen P Dunn
*Assistant Examiner* — Nicholas A Wang
(74) *Attorney, Agent, or Firm* — Fish & Richardson P.C.

(57) ABSTRACT

A method includes producing an amorphous precursor to a nanocomposite, the amorphous precursor comprising a material that is substantially without crystals not exceeding 20% volume fraction; performing devitrification of the amorphous precursor, wherein the devitrification comprises a process of crystallization; forming, based on the devitrification, the nanocomposite with nano-crystals that contains an induced magnetic anisotropy; tuning, based on one or more of composition, temperature, configuration, and magnitude of stress applied during annealing and modification, the magnetic anisotropy of the nanocomposite; and adjusting, based on the tuned magnetic anisotropy, a magnetic permeability of the nanocomposite.

37 Claims, 14 Drawing Sheets

(51) Int. Cl.
*H01F 41/02* (2006.01)
*G01R 33/00* (2006.01)

(56) References Cited

U.S. PATENT DOCUMENTS

| | | | |
|---|---|---|---|
| 5,994,899 A | 11/1999 | Mohri | |
| 6,425,960 B1* | 7/2002 | Yoshizawa | H01F 1/15308 148/121 |
| 6,727,692 B2 | 4/2004 | Ciureanu et al. | |
| 6,747,449 B1 | 6/2004 | Maylin et al. | |
| 2001/0043134 A1 | 11/2001 | Decristofaro et al. | |
| 2002/0189718 A1* | 12/2002 | Yoshizawa | C22C 45/04 148/313 |
| 2004/0103725 A1 | 6/2004 | Tomka et al. | |
| 2010/0265028 A1 | 10/2010 | McHenry et al. | |

OTHER PUBLICATIONS

Ohnuma, M. et al. "Origin of the magnetic anisotropy induced by stress annealing in Fe-based nanocrystalline alloy." 2005. 86. p. 1-3.*

Miguel, C. et al. "effect of stress and/or field annealing on the magnetic behavior of the (Co77Si13.5B9.5)90Fe7Nb3 amorphous alloy" 2005. Journal of applied physics. 97. p. 1-8 (Year: 2005).*

Ohnuma et al., "Origin of the magnetic anisotropy induced by stress annealing in Fe-based nanocrystalline alloy," Appl. Phys. Lett., 86(152513):1-4 (2005).

Ershov et al., "Relaxation of the state with induced transverse magnetic anisotropy in the soft magnetic nanocrystalline alloy Fe73.5Si13.5Nb3B9CuI," Physics of the Solid State, 54(9):1817-1826 (2012) http://www.springerlink.com/index/10.1134/S1063783412090119.

Ershov et al., "Effect of thermomagnetic and thermomechanical treatments on the magnetic properties and structure of the nanocrystalline soft magnetic alloy Fe81Si6Nb3B9CuI," Physics of the Solid State, 55(3):508-519 (2013) http://link.springer.com/10.1134/S1063783413030098.

D.I. Gordon and R.E. Brown, "Recent Advances in Fluxgate Magnetometry," IEEE Transactions on Magnetics, vol. MAG-8(1):76-82 (1972).

Mohri et al., "Magneto-Impedance Element," IEEE Transactions on Magnetics, 31(4):2455-2460 (1995).

Ripka et al., "Nanocrystalline Fluxgate Cores with Transverse Anisotropy," Sensors, Proceedings of the IEEE, 2004, pp. 1570-1572.

P. Ohodnicki et al., "Transmission electron microscopy study of large field induced anisotropy $(Co_{1-x}Fe_x)_{89}Zr_7B_4$ nanocomposite ribbons with dilute Fe-contents," Journal of Magnetism and Magnetic Materials, vol. 322, No. 3, pp. 315-321, Feb. 2010.

S. J. Kernion et al., "Giant induced magnetic anisotropy in strain annealed Co-based nanocomposite alloys," Applied Physics Letters, vol. 101, No. 10, p. 1-5, 2012.

S. Ishio et al., "Magnetostriction constants of fcc Co—Fe—Ni alloys," Journal of Magnetism and Magnetic Materials, vol. 164, pp. 208-210, 1996.

A. Chaturvedi et al., "Giant magnetoimpedance and field sensitivity in amorphous and nanocrystalline $(Co_{1-x}Fe_x)_{89}Zr_7B_4$ (x=0, 0.025, 0.05, 0.1) ribbons," Journal of Applied Physics, vol. 109, p. 07B508, 2011.

N. Laurita et al., "Enhanced giant magnetoimpedance effect and field sensitivity in Co-coated soft ferromagnetic amorphous ribbons," Journal of Applied Physics, vol. 109, p. 07C706, 2011.

S. Patri et al., "Magnetic domain refinement of silicon-steel laminations by laser scribing," J. Mat Sci. 31, 1693-1702 (1996).

* cited by examiner

210

220

TUNABLE ANISOTROPY OF CO-BASED NANOCOMPOSITES FOR MAGNETIC FIELD SENSING AND INDUCTOR APPLICATIONS

CLAIM OF PRIORITY

This application claims the benefit of priority under 35 U.S.C. § 119(e) to provisional U.S. Patent Application No. 61/855,439, filed on May 15, 2013, the entire contents of which are hereby incorporated by reference.

STATEMENT REGARDING FEDERALLY SPONSORED RESEARCH AND DEVELOPMENT

This invention was made with partial government support under grant DEAR0000219 awarded by the Department of Energy (DOE) and the Advanced Research Projects Agency-Energy (ARPA-E) and other government support from the U.S. Army. The government has certain rights in the invention.

GOVERNMENT RIGHTS

The techniques described herein were made with government support by the Advanced Research Projects Agency-Energy (ARPA-E), DOE contract #: DEAR0000219. The government may have certain rights in this intellectual property.

FIELD OF USE

The present disclosure relates to a class of soft magnetic materials with tunable magnetic permeability, low core losses at high frequencies and methods of manufacturing the same. These materials and their magnetic properties are stable to high temperatures with relevant applications that include transformer and inductor cores and sensing elements in magnetic field sensors. Specifically the present disclosure pertains to compositions for and methods to impart highly tunable and robust/stable anisotropy in nanocomposite ribbons with Co-rich compositions.

BACKGROUND

Nanocomposite soft magnetic materials comprise crystalline grains smaller than 100 nm embedded within an amorphous matrix. Extensive research into this class of materials resulted in their use in a wide range of soft magnetic applications. The extended set of processing dimensions in nanocomposites, such as grain size, phase identity, crystal orientation and volume fraction, present opportunities to tailor properties. Several classes of nanocomposite alloys exist, e.g., as described in U.S. Pat. No. 4,881,989, U.S. Pat. No. 5,935,347, and U.S. Patent Publication No. 2010/0265028. Compositions typically consist of compositions (TL-TE-M) involving combinations of late transition metals (TL), early transition metals (TE), and metalloids (M). Compositions (such as those described in U.S. Pat. No. 5,935,347) also require small additions of noble metals such as Cu to promote finer grain structures. The Curie temperature of the amorphous phase in iron (Fe) rich nanocomposite alloys is typically below 400° C. and soft magnetic properties degrade approaching and above this temperature. Cobalt additions can increase the amorphous phase Curie temperature, as described in U.S. Patent Publication No. 2010/0265028, and extend useful range of operating temperatures.

The introduction of a uniaxial magnetic anisotropy in nanocomposite soft magnetic materials is a well-known technique to control permeability. Magnetic permeability ($\mu$) is the change in induction (B) with an applied field (H) and is equal to the slope of a magnetization curve. Both high and low permeabilities may be advantageous depending on the application and it is often desirable to tune permeability to a specific value. In particular, flat loop magnetization with linear response of the magnetization with applied field, to a field designated as the anisotropy field, $H_K$, where the magnetization reaches it saturation value, $M_s$, are desirable for many applications. In flat loop materials the permeability at a fixed temperature remains approximately single valued up to the saturating field, $H_K$, and given by:

$$\mu = M_s / H_K$$

For low permeability materials in toroidal cores that show linear magnetization responses, the anisotropy energy density $K_u$ is:

$$K_u = \frac{M_s H_k}{2} = \frac{B_s^2}{2\mu}.$$

Here, $B_s$ is the saturation induction and the permeability $\mu$ is inversely proportional to the energy density for wound cores with transverse induced anisotropy.

The manufacturing process to make nanocomposites of this type typically include an annealing step where one or more crystalline phases is nucleated and grown within an amorphous precursor material. Several processing methods are available during annealing to develop magnetic anisotropies including the introduction of a magnetic and/or stress field. The use of an amorphous precursor limits the geometry of nanocomposite soft magnets to a critical cooling dimension and these materials often take the shape of cast ribbons resulting from a melt spinning technique or wires drawn from a melt. These ribbons may be tape wound or stamped and stacked (as described in U.S. Patent Publication No. 2001/0043134) into cores for use. Stresses in the final component include residual stresses formed during the casting process, those induced during the annealing, as well as any further processing step such as winding, impregnating, and cutting. Successful devices require adequate control over all processing steps to include or reduce stresses where desired for a specific application.

The induced magnetic anisotropy and demagnetization field, $H_d$, created by the core shape influences the domain pattern in the core. Free magnetic poles on the surface create the demagnetization field, which tend to bend field lines in the material. Toroidal shapes minimize demagnetization effects for materials with domains oriented along the circumference. Referring to FIG. 1, diagram 100 shows two domain orientations in a tape wound core, e.g., domain patterns in strain annealed tape-wound cores with transverse (left) patterns 102 and longitudinal (right) domain patterns 104. The direction of the induced anisotropy and the demagnetization field of the core shape determine the primary domain orientation. Annealing materials with negative and positive magnetostriction ($\lambda$) in the crystalline phase under tension can result in transverse and longitudinal domain patterns respectively depending on annealing conditions. Dynamic magnetization processes are complicated but transverse domains in wound core material tend to change magnetization by rotation whereas longitudinal domains change magnetization by domain wall motion. The sign of the magnetostriction in the crystalline phase of Fe—Si nanocomposites controls the direction of the induced easy axis within a plane oriented based on the primary stress direction.

The direction of the magnetic easy axis determines permeability of the core. Referring to FIG. 2, diagram 110 shows the resulting magnetization vs. field curves for soft magnetic cores with different induced magnetic anisotropies. In particular, diagram 110 shows magnetization vs. field curves of A) annealed core without an applied field/stress, B) longitudinally field annealed or strain annealed core resulting in primarily longitudinal domains, and C) transverse field annealed or strain annealed core resulting in primarily transverse domains. Curve A results after annealing without an external magnetic/stress field and is the result of the well know random exchange phenomenon. The high permeability shown in Curve B can result from annealing in a longitudinal magnetic field or by strain annealing ribbon with positive magnetostriction in the crystalline phase under tension. The longitudinal magnetic field is applied in the same direction as the excitation field created by the windings on a toroidal core (circumferential). The low permeability shown in Curve C can result from annealing cores in a transverse magnetic field (perpendicular to the excitation field) and/or strain annealing ribbon with negative magnetostriction in the crystalline phase.

Properties in nanocomposites may differ from as-cast or mostly amorphous materials of similar compositions. Magnetostriction is primarily determined by composition and structure of the material, temperature, and stress. The crystalline phase composition often differs from the residual amorphous phase composition and apparent magnetostriction values are composed of contributions from each phase. Crystalline phases also offer additional processing variables such as ordering of atoms/defects, preferred orientations, and the volume fraction of crystals that are useful in the development of anisotropies. In strain annealed Fe-rich nanocomposite cores, the resulting permeability shows an inverse relationship to the magnitude of the stress field applied during annealing. Determination of the underlying mechanism behind the permeability change in magnetic field annealing has proven elusive, but evidence of residual lattice strain in strain annealed materials has been shown. (See, e.g., Ohnuma et al., "Origin of the magnetic anisotropy induced by stress annealing in Fe-based nanocrystalline alloy," Appl. Phys. Lett., vol. 86, no. 152513, pp. 1-4, 2005). This has been duplicated and the effect of strain annealing materials with positive and negative crystal phase magnetostrictions in the FeSi composition range has been demonstrated. (See, e.g., Ershov et al., "Relaxation of the state with induced transverse magnetic anisotropy in the soft magnetic nanocrystalline alloy Fe73.5Si13.5Nb3B9Cu1," Physics of the Solid State, vol. 54, no. 9, pp. 1817-1826, September 2012. http://www.springerlink.com/index/10.1134/S1063783412090119; and Ershov et al., "Effect of thermomagnetic and thermomechanical treatments on the magnetic properties and structure of the nanocrystalline soft magnetic alloy Fe81Si6Nb3B9Cu1," Physics of the Solid State, vol. 55, no. 3, pp. 508-519, March 2013. http://link.springer.com/10.1134/S1063783413030098). This work also showed that while the anisotropy induced by magnetic field annealing is largely erasable at temperatures above ~250° C., strain induced anisotropies were stable to much higher temperatures. However, the low Curie temperature of the amorphous phase in Fe-rich alloys prevents the exploitation of the thermal stability of the induced anisotropy for elevated temperature applications. Additionally, the brittle nature of crystallized Fe-rich compositions limits the accessible range of induced anisotropies and make core winding difficult.

Nanocomposite ribbons can be subsequently crushed into flake and then consolidated by compaction techniques. The uniaxial anisotropy can be exploited to align the flakes in an applied field prior to compaction. This alloys for retaining anisotropy in shapes possible through consolidation.

Fluxgate and giant magnetoimpedance (GMI) magnetic field sensors require soft magnetic sensing elements. The sensing element in a fluxgate magnetometer is typically a soft magnetic core that is alternately driven to saturation by a drive coil. (See D. I. Gordon and R. E. Brown, "Recent Advances in Fluxgate Magnetometry," IEEE Transactions on Magnetics, vol. MAG-8, no. 1, pp. 76-82, 1972). When placed in an external field, the core saturates asymmetrically producing even harmonics proportional to the field strength according to Faraday's law. GMI sensors measure changes in the impedance ($Z=R+j\omega L$) of a soft magnetic sensing element where R is the dc resistance and L is the inductance. (See Mohri et al., "Magneto-Impedance Element," IEEE Transactions on Magnetics, vol. 31, no. 4, pp. 2455-2460, 1995). The skin depth of the sensing element is sensitive to permeability and resistivity. In GMI sensors, the primary mechanism that determines field sensitivity $\Delta z_{(H)}/z_{(H)}$ involves control of permeability in the sensing element. The defining measure of sensor performance is the signal to noise ratio. Random jumps in magnetization in the sensing element (Barkhausen noise) degrade performance and should be minimized through the use of a low loss sensing element. Amorphous materials have been used with success in fluxgate cores and GMI sensors, but show thermal instabilities at high temperature and are not applicable for high temperature applications such as deep drilling operations or current sensing in high temperature electronics.

Deep well drilling requires robust sensor packages that can operate in a harsh environment of corrosive fluids and temperatures and pressures in excess of 200° C. and 20 ksi. The sensor package relays parameters such as torque, temperature, and bit azimuth to an operator in real time to ensure drilling accuracy. The magnetometer in the sensor package can be used to provide azimuth information with respect to the earth's field or to home in on a separate magnetic source, as required for relief well intersections. However, the crystallization temperature of amorphous materials limits their structural stability and prevents their use in high temperature applications.

Controlling the permeability of the sensing element can be used to reduce the noise in fluxgates (See Ripka et al., "Nanocrystalline Fluxgate Cores with Transverse Anisotropy," in Sensors, Proceedings of the IEEE, 2004, pp. 1570-1572) and to tune the field response of a GMI sensor, as described in U.S. Pat. No. 5,994,899, U.S. Pat. No. 6,747,449, US Publication No. 2004/0403725, and U.S. Pat. No. 6,727,692. Transverse anisotropy is preferable in ring or racetrack fluxgate cores and the preferred anisotropy direction in GMI sensing elements is shown in diagram 120 of FIG. 3. Fe-based nanocomposites are limited due to relatively low Curie temperatures in the amorphous phase and a limited response to stress annealing. Additionally, for materials that require robust mechanical properties, the brittle nature of Fe-based materials after crystallization limits their use. The composition of Co-rich nanocomposites can be varied to achieve brittle or ductile ribbons after crystallization, depending on the application requirement. What is needed is a soft magnetic material that is stable at high temperatures with a strong response to stress annealing. This induced anisotropy and resulting anisotropy field, in this material should also be tunable for a range of applications up a high value. Preferably, the material should exhibit adequate mechanical properties such as ductility after thermo-mechanical processing to allow for successful fabrication of robust devices.

SUMMARY

In one embodiment, a method includes producing an amorphous precursor to a nanocomposite, the amorphous precursor comprising a material that is substantially without crystals not exceeding 20% volume fraction; performing devitrification of the amorphous precursor, wherein the devitrification comprises a process of crystallization; forming, based on the devitrification, the nanocomposite with nano-crystals that contains an induced magnetic anisotropy; tuning, based on one or more of composition, temperature, configuration, and magnitude of stress applied during annealing and modification, the magnetic anisotropy of the nanocomposite; and adjusting, based on the tuned magnetic anisotropy, a magnetic permeability of the nanocomposite.

In some examples, the nanocomposite has a ribbon geometry with a thickness of 10-35 microns. The nanocomposite has a wire geometry with a thickness of 1-20 microns and a glass coating thickness between 0.5-20 microns. Performing stress annealing comprises: applying stress to the amorphous precursor at an annealing temperature to create the nanocomposite. The stress can be applied in direct tension, compression, bending, and/or centripedal direction. Applying tension to the amorphous precursor comprises: applying heat with one or more thermal blocks in contact with to the amorphous precursor to evenly distribute heat; using a feedback system to adjust annealing temperature and/or tension applied by a strain annealing system. Modification of the geometry comprises modification of one or more of a size of one or more of the nano-crystals the nanocomposite is a magnetic material that is included as a sensing element in a magnetic field sensor. The actions include adjusting a composition of the nanocomposite; and adjusting annealing parameters for use in the stress annealing; wherein tuning the magnetic anisotropy comprises: tuning, based on the adjusted composition and the adjusted annealing parameters, the magnetic anisotropy. The nanocomposite includes 30 atomic % or less of Iron (Fe) or Nickel (Ni) and 50 atomic % or less of one or more metals selected from the group comprising boron (B), carbon (C), phosphorous (P), silicon (Si), chromium (Cr), tantalum (Ta), niobium (Nb), vanadium (V), copper (Cu), aluminum (Al), molybdenum (Mo), manganese (Mn), tungsten (W), cobalt (Co) and zirconium (Zr).

In another embodiment, a nanocomposite comprises cobalt (Co), 30 atomic % or less of Iron (Fe) or Nickel (Ni) and 50 atomic % or less of one or more metals selected from the group comprising boron (B), carbon (C), phosphorous (P), silicon (Si), chromium (Cr), tantalum (Ta), niobium (Nb), vanadium (V), copper (Cu), aluminum (Al), molybdenum (Mo), manganese (Mn), tungsten (W), and zirconium (Zr); wherein the nanocomposite has a composite structure with crystalline grains less than approximately 50 nanometers in average diameter embedded within an amorphous matrix; and wherein the nanocomposite is formed through a thermo-mechanical process that includes at least one mechanical operation and at least one thermal operation. In some examples, the at least one thermal operation comprises a rapid solidification operation that includes melt-spinning or wire-drawing from a liquid melt. The amorphous precursor is electrodeposited or sputtered onto a substrate as a film with thickness less than 10 microns prior to annealing, wherein the substrate is pre-stressed prior to deposition/sputtering or stress applied after deposition/sputtering to induce anisotropy. The at least one mechanical operation comprises application of a tensile strain along a longitudinal axis of a ribbon or a wire, during an elevated temperature annealing treatment above approximately 200° Celsius to control a permeability of the nanocomposite. The applied tensile strain is less than approximately 200 megapascal (MPa) and an effective induced anisotropy is tunable above approximately 20 kJ/m$^3$. An effective induced anisotropy is tunable above approximately 30 kJ/m$^3$. The nanocomposite is included in a magnetic sensing material, an inductor, or a motor material. A resulting anisotropy energy density per megapascal (MPa) of the applied tensile strain is greater than approximately 100 J/m 3 MPa. The nanocomposite is annealed in a magnetic field applied at any angle with respect to the applied stress. An as-cast material is thinned to reduce eddy currents by rolling and/or mechanical abrasion with or without applied temperature. The nanocomposite is powdered by a milling operation. The nanocomposite is powdered by a milling operation. An amorphous powder is produced by water atomization, plasma torch synthesis, or a rapid quench technique. The powder is annealed under temperature under stress and/or magnetic field.

The nanocomposite is formed from an alloy, and wherein the alloy is dilute or substantially free of hafnium (Hf), zirconium (Zr), and titanium (Ti), wherein dilute corresponds to a total of less than 2 atomic % of all of Hf, Zr and Ti, and substantially free corresponds to less than 0.5 atomic % of a combination of Hf, Zr and Ti. An amorphous precursor of the alloy has a Curie temperature greater than approximately 500° Celsius. The nanocomposite is in wire form. The strain to fracture ε in the nanocomposite is greater than 1%, as determined by ε=d D−d where d is the thickness of a material used in producing the nanocomposite and D is the diameter of a 180° bend. The nanocomposite is capable of being stamped for use in one or more of a motor stator and a rotor. A saturation induction is greater than 0.9 T. The relative permeability is tunable from 10 to 100 for use in low loss inductive applications. A composition is chosen to induce square loops and high permeability, and wherein the composition comprises $Co_{77.2}Fe_{1.4}Mn_{1.4}Nb_4B_{14}Si_2$. Resonant frequency is tunable as defined by $f_r = \sqrt{M_s H_k}$. The nanocomposite acts as an electromagnetic interference (EMI) shielding material, is capable of being crushed, milled, or powdered and compacted into a form with or without a binding agent, and wherein the compaction can be accomplished with or without an applied magnetic field to align particles in the nanocomposite. One or more properties of the nanocomposite enable being planar flow casting without a protective vacuum. The nanocomposite is a wire, and wherein the wire is a sensing element in a wirelessly interrogable device. The nanocomposite in the wire form is capable of operation at temperatures above 150° Celsius. The motor stator with the nanocomposite or the rotor with the nanocomposite is capable of operation above 200° Celsius. In still another embodiment, a magnetic field sensor element comprises cobalt (Co); 30 atomic % or less of Iron (Fe); and 50 atomic % or less of one or more metals selected from the group comprising boron (B), carbon (C), phosphorous (P), silicon (Si), chromium (Cr), tantalum (Ta), niobium (Nb), vanadium (V), copper (Cu), aluminum (Al), molybdenum (Mo), manganese (Mn), tungsten (W), and zirconium (Zr); wherein the magnetic field sensor element has a nanocomposite structure with crystalline grains less than approximately 50 nanometers in average diameter embedded within an amorphous matrix; wherein the magnetic field sensor element is formed through performance of stress annealing on an amorphous precursor material to tune an anisotropy of the magnetic field sensor.

Details of one or more implementations are set forth in the accompanying drawings and the description below. Other features, objects, and advantages will be apparent from the description, the drawings, and the claims.

DETAILED DESCRIPTION

Figure 1:
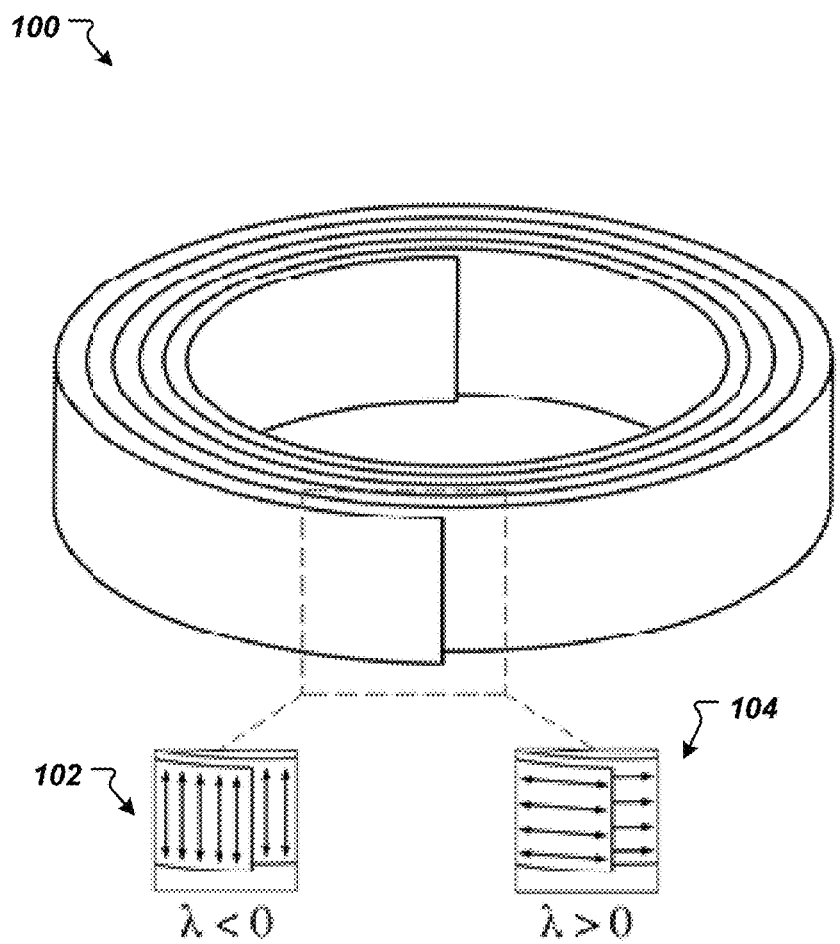
FIG. 1 is a diagram of domain orientations in a tape wound core.
Figure 2:
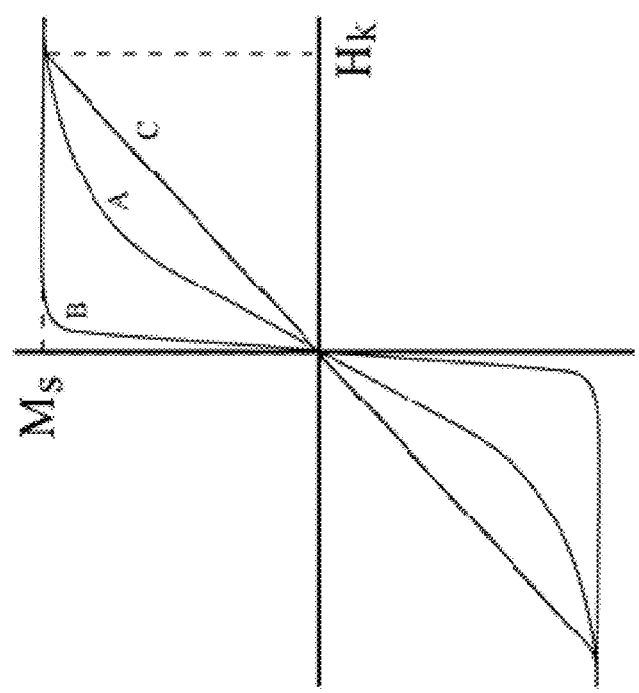
FIG. 2 is a diagram of magnetization vs. field curves for soft magnetic cores with varying induced magnetic anisotropies.
Figure 3:
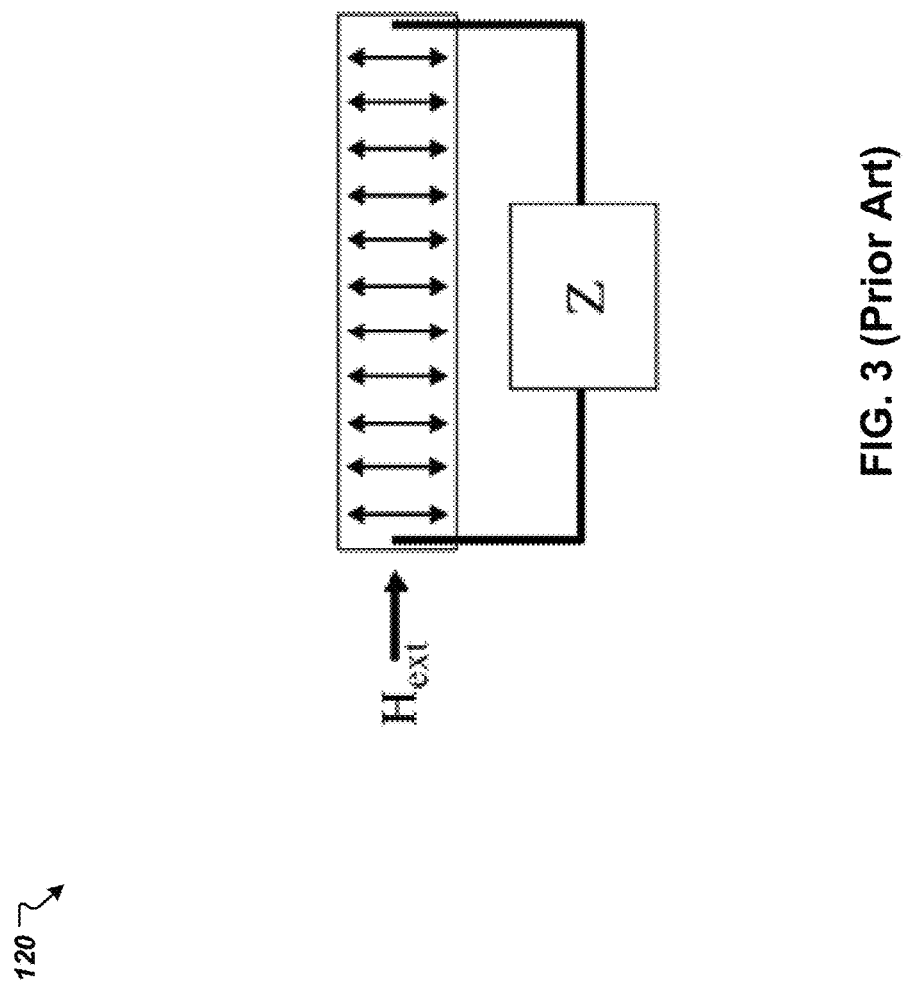
FIG. 3 is a diagram of preferred anisotropy direction for sensing element in a GMI sensor.

A nanocomposite soft magnetic alloy with tunable magnetic anisotropy, good thermal stability, and improved mechanical properties is described herein. Relevant alloys are Co-rich and include 30 atomic % or less of Iron (Fe) or Nickel (Ni) and 50 atomic % or less of one or more metals selected from the group comprising boron (B), carbon (C), phosphorous (P), silicon (Si), chromium (Cr), tantalum (Ta), niobium (Nb), vanadium (V), copper (Cu), aluminum (Al), molybdenum (Mo), manganese (Mn), tungsten (W), and zirconium (Zr). Amorphous precursors are created by a rapid quench technique and the nanocomposite is formed by thermal annealing under an applied strain field with or without an applied magnetic field. Tunable anisotropies may be created greater than 30 kJ/m³ and the direction of the induced anisotropy is controllable by adjustments to composition and annealing technique. Relevant applications of the material include inductors, sensors, and motors.

The techniques described herein enable the production and processing of soft magnetic nanocomposite materials with tunable anisotropies suitable for power electronic cores and for sensing elements in magnetic field sensors. The anisotropy induced by strain or field annealing is larger than anisotropies measured in other existing alloys and in strain annealing, requires less strain per unit of anisotropy. The induced anisotropy is tunable up to high energy densities that result in high or low permeabilities and is stable to high temperature. In addition to the requirement of lower stress per unit of induced anisotropy, the mechanical properties of the material are also improved compared to existing alloys that tend to become brittle after crystallization. These features overcome limitations in strain annealed Fe-based nanocomposite materials that become brittle during crystallization and limit the useful range of induced anisotropy.

In an example, Co-rich FeCo nanocomposite materials comprising a crystalline phase are embedded within an amorphous matrix that show a strong response to stress annealing with improved mechanical properties. These materials consist of compositions (TL-TE-M) involving combinations of late transition metals (TL), early transition metals (TE), and metalloids (M). The metalloids and early transition elements improve the material's glass forming ability and limit diffusion and grain size. By adjusting the composition and the annealing parameters, the size and structure of the nanocrystals may be refined resulting in optimal magnetic properties.

In both polycrystalline $Fe_{1-x}Co_x$ and amorphous $(Fe_{1-x}Co_x)_{80}B_{20}$ system, the sign of magnetostriction changes from positive to negative around 9:1 approaching the Co-rich compositions. (See O'Handley R C. Modern Magnetic Materials: Principles and Applications: Wiley Inter-Science, 1999.) Low loss materials require low magnetostriction so materials with small net positive or negative magnetostrictions are desired for strain annealing. Magnetostriction zero crossings exist in the Co-rich compositions of several ternary systems such as CoFeNi and CoFeMn. The net magnetostriction is the combination of the magnetostrictions of the amorphous and crystalline phases. Often the compositions of these phases differ from the master alloy composition due to partitioning during crystallization. The response of Co-rich nanocomposites to both field and stress annealing is very strong. In an example, a peak response to field annealing resulting in induced anisotropy ($K_u$) is above 2 kJ/m³ near x=0.97 in $(Fe_{1-x}Co_x)_{89}Zr_7B_4$. In another example, $K_u$ values approach 20 kJ/m³ in similar compositions using strain annealing. The strain annealing response of Co-rich nanocomposites is twice the strain annealing response measured in Fe-rich nanocomposite compositions as measured on a per-unit applied stress basis. Not only does a given stress level produce higher induced anisotropy in Co-rich materials, but higher induced anisotropies are also achievable. The Curie temperature of the amorphous phase in Co-rich alloys can exceed 600° C. compared to approximately 400° C. or less in Fe-rich compositions. Additionally, whereas most nanocomposite alloys to date are brittle following the annealing process, these alloys have improved mechanical properties and in particular strain to fracture.

In order to overcome the low thermal stability of amorphous materials, the nanocomposite form is preferred. These materials are formed by a devitrification of the amorphous precursor with suitable compositions to limit grain growth. The amorphous precursor is produced by a rapid solidification technique such as melt spinning or wire drawing. Co-rich nanocomposite alloys can undergo multiphase crystallization resulting in a mixture of body centered cubic (bcc), face centered cubic (fcc), and hexagonal close packed (hcp) grains. Enrichment in either Co, Fe, and/or the TE and M components of the composition cause fluctuations in local compositions compared to the nominal ingot composition. The zero crossing for magnetostriction in FeCo alloys occurs near 91% Co and serves as a guideline for composition and processing decisions depending on the desired application. Suitable choice of composition and annealing procedures result in anisotropy energy densities above 20 kJ/m$^3$ corresponding to relative permeabilities below ~20.

Figure 4:
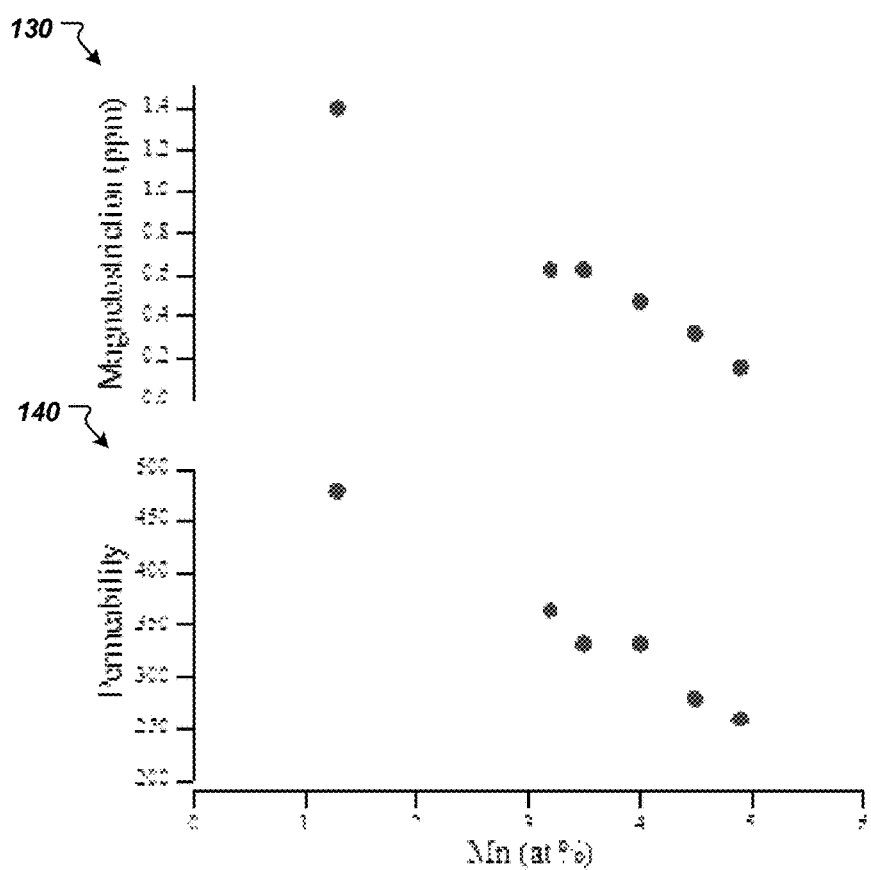
FIG. 4 is a diagram of the effects of magnetostriction on the induced anisotropy in strain annealed ribbons.

Referring to FIG. 4, diagram 130 shows the effect of magnetostriction on the induced anisotropy in strain annealed ribbons. Increasing manganese (Mn) content in a composition with near zero magnetostriction in the amorphous phase ($Co_{77.2}Fe_{1.4}Mn_{1.4}Nb_4B_{14}Si_2$) results in decreasing positive magnetostriction in the nanocomposite after annealing under similar conditions without strain. Here, the composition varies as $Co_{77.2-x}Fe_{1.4}Mn_xNb_4B_{14}Si_2$ and control of the magnetostriction through alloy composition allows for tunable permeability materials. Diagram 140 shows the relationship between permeability and Mn content. As shown, as the percentage of Mn increases, the permeability decreases.

Figure 5:
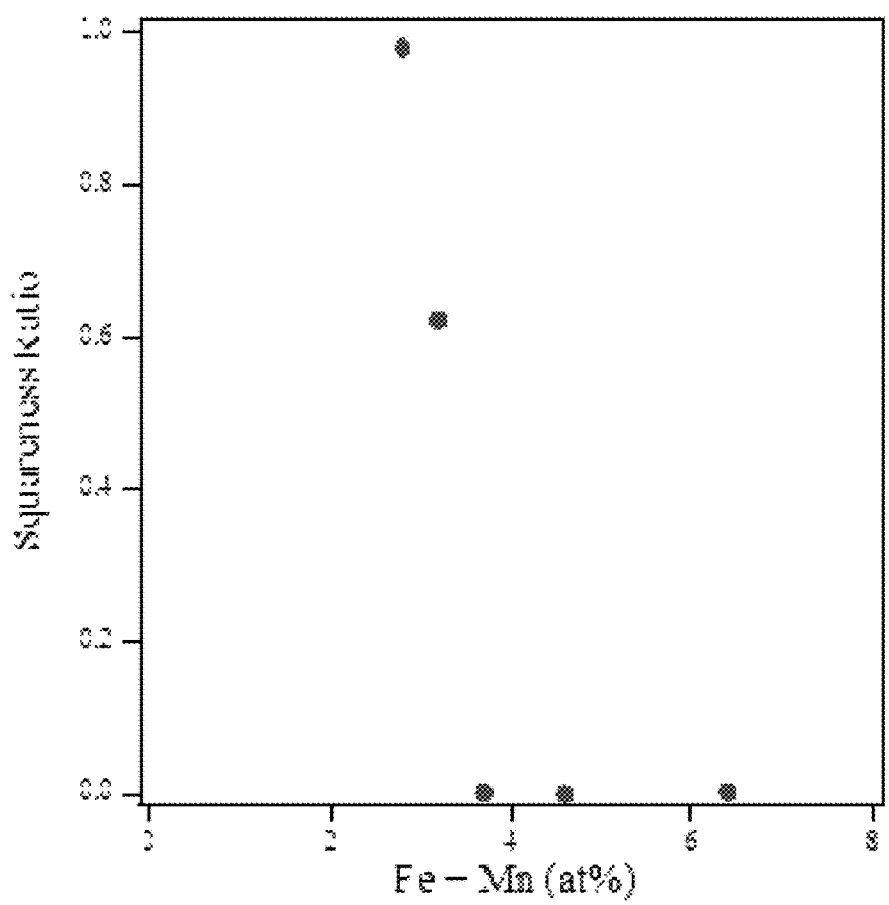
FIG. 5 is a diagram of squareness ratio vs. iron and manganese composition.

Referring to FIG. 5, diagram 150 illustrates the squareness ratio vs. iron and manganese composition in the $Co_{77.2-2x}(FeMn)_xNb_4B_{14}Si_2$ alloy series as a result of strain annealing. Squareness is the ratio of the remnant induction to the saturation value. Materials with squareness values approaching unity have high permeabilities and materials with low squareness have low permeability. As shown, both high and low permeability material can be created by composition adjustment in Co-rich strain annealed materials.

Figure 6:
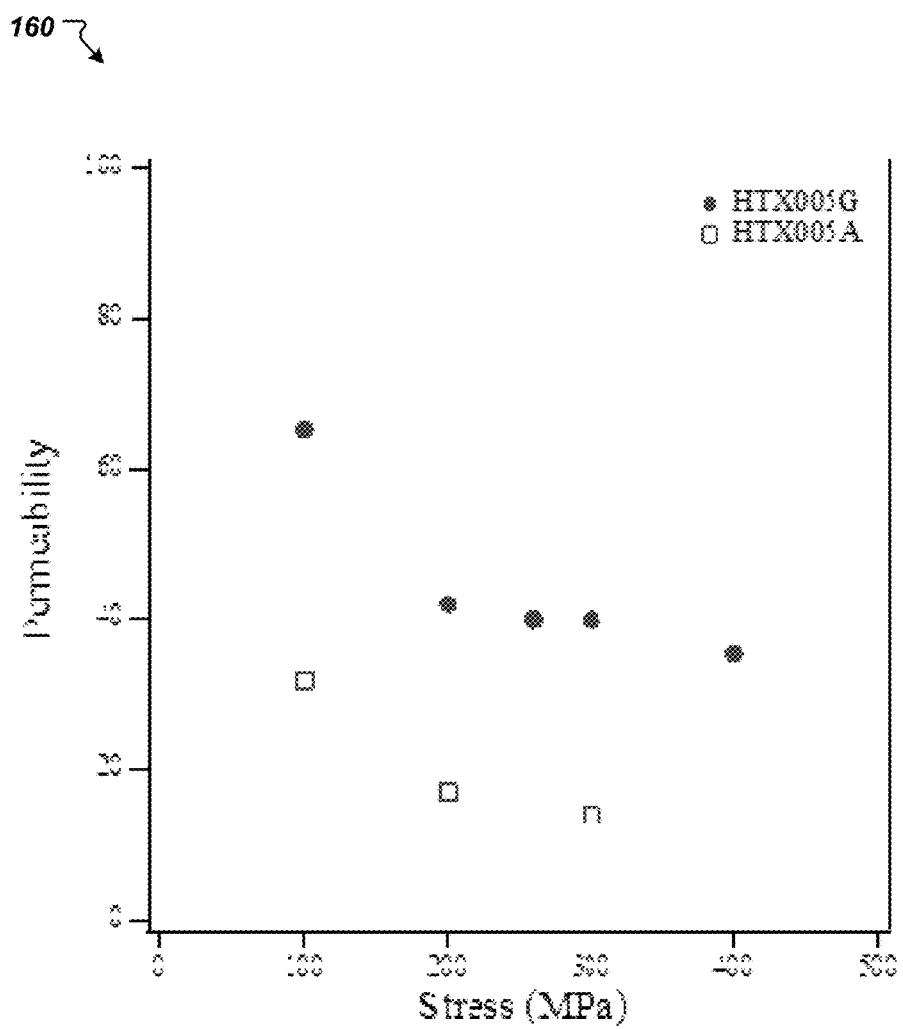
FIG. 6 is a diagram of the effects of stress on permeability.

Referring to FIG. 6, diagram 160 shows the permeability achieved after strain annealing in compositions with different Fe and Mn content at different stress levels. Lower permeability is achieved in $Co_{73.6}Fe_{3.2}Mn_{3.2}Nb_4B_{14}Si_2$ (HTX005A) compared to $Co_{75.4}Fe_{2.3}Mn_2.3Nb_4B_{14}Si_2$ (HTX005G) and permeability initially decreases rapidly with stress until approximately 200 MPa at which level the dependence becomes weaker. The relationship between increasing stress and decreasing permeability is a general one that is observed ubiquitously. Here, tunable permeability is also achieved by adjusting processing conditions during strain annealing.

Figure 7:
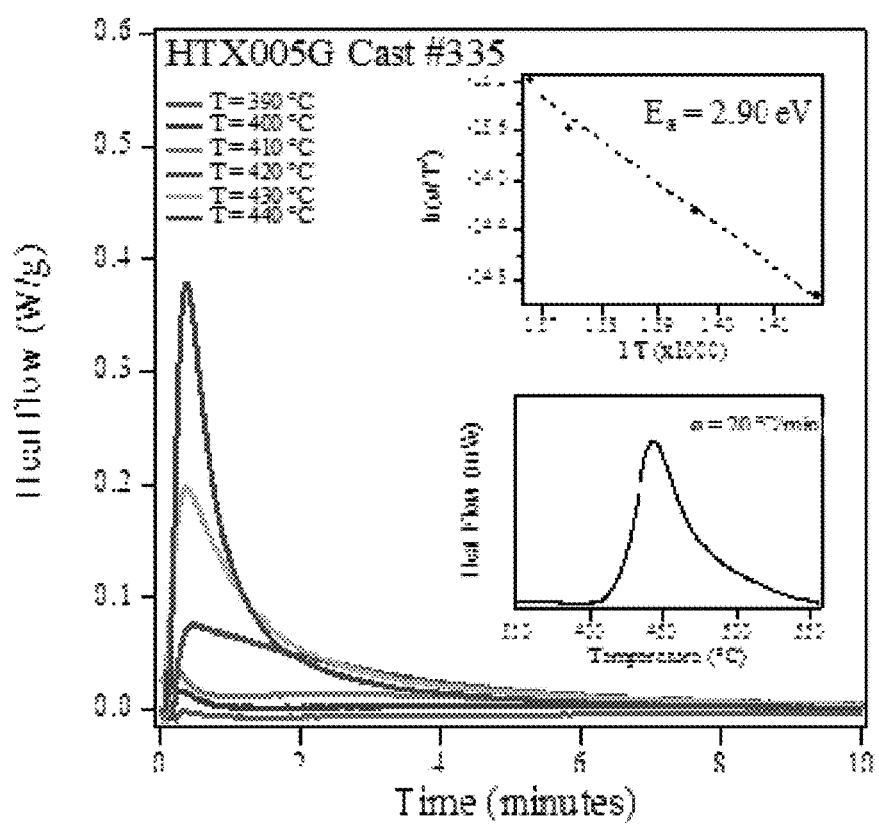
FIG. 7 is a diagram of isothermal differential scanning calorimetry.
Figure 8:
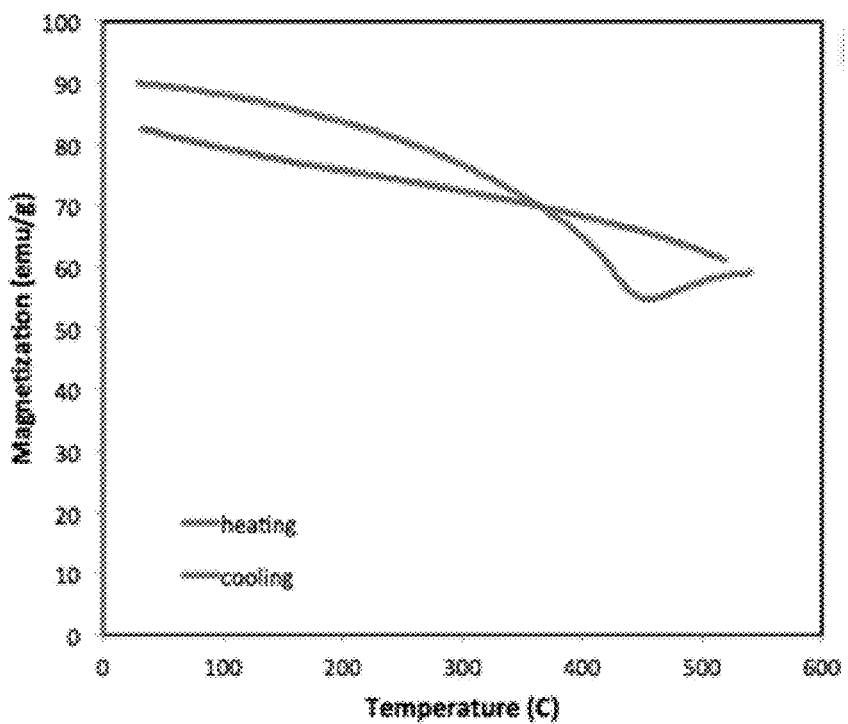
FIG. 8 is a diagram of magnetization vs. temperature for heating and cooling of a cast material.

It is advantageous for the crystallization process to occur quickly in strain annealing to allow for high production rates. Referring to FIG. 7, diagram 170 shows differential scanning calorimetry data for $Co_{75.4}Fe_{2.3}Mn_{2.3}Nb_4B_{14}Si_2$, which can provide an indication of the onset and completion of crystallization. The data demonstrates that the onset of crystallization in constant heating rates occurs at 420 C and is largely independent of the heating rate. Isothermal heating results shown in FIG. 7 shows the decrease in required time to complete the crystallization process at different temperatures and illustrates that for certain temperatures the crystallization can begin and complete within seconds which is compatible with requirements imposed by production scale-up. Crystallization can also be measured magnetically, as in diagram 180 FIG. 8. Here, a $Co_{75.4}Fe_{2.3}Mn_2.3Nb_4B_{14}Si_2$ as-cast sample is heated and magnetization monitored as a function of temperature in a vibrating sample magnetometer. The high Curie temperature of the amorphous phase is evident and the crystallization process is measured as the increase in magnetization during heating. The phase identity of the crystalline phase is highly faulted close packed crystals with an average size of approximately 5 nm as shown in FIGS. 11-12.

Figure 9:
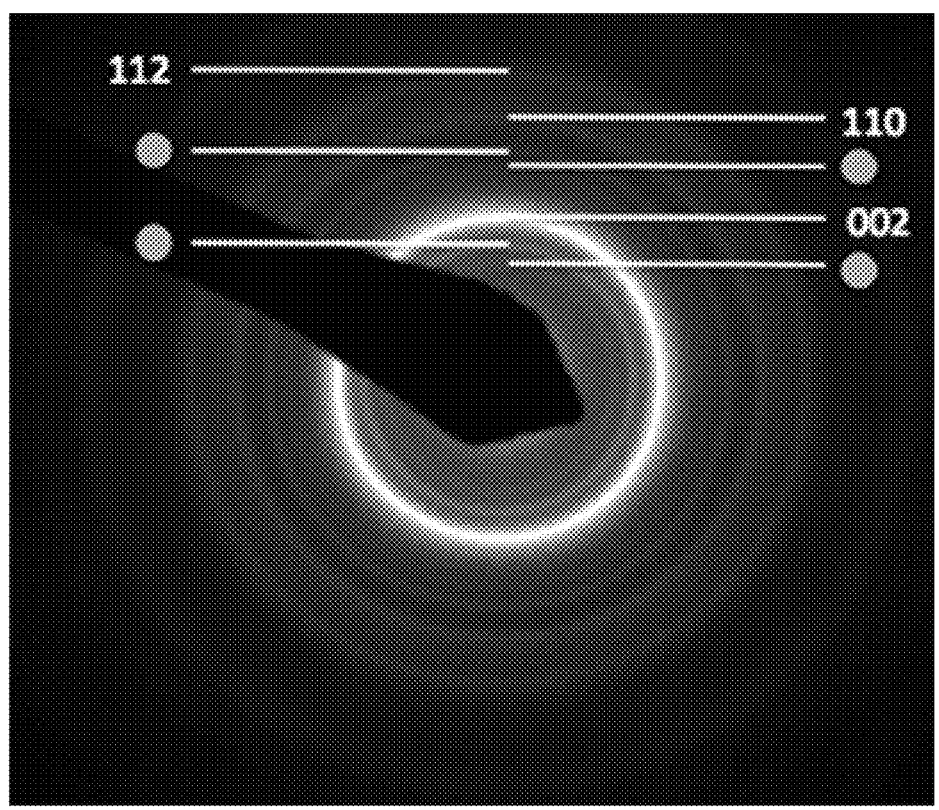
FIG. 9 is a diagram of an electron diffraction pattern of HTX005g annealed for 1 hour at 520° Celsius.

Referring to FIG. 9, diagram 190 illustrates an electron diffraction pattern of $Co_{75.4}Fe_{2.3}Mn_{2.3}Nb_4B_{14}Si_2$ annealed for 1 hr at 520° Celsius without applied stress. The pattern shows diffraction rings corresponding to scattering from randomly oriented close packed reflections. Sharp reflections exist for planar spacings corresponding to H–K=3N in the hcp HKL lattice. The first three such rings, {002}, {110}, and {112}, annotated in FIG. 9 correspond to the hcp lattice with a=2.51 Å and c=4.08 Å. These rings can also be described using {111}, {022}, and {113} planes in the fcc lattice respectively with a lattice constant of 3.54 Å. These reflections are consistent with planar faulting in close packed structures. The additional rings annotated with green circles in FIG. 9 are thought to match reflections from multiple planar spacing resulting from planar defects.

Figure 10:
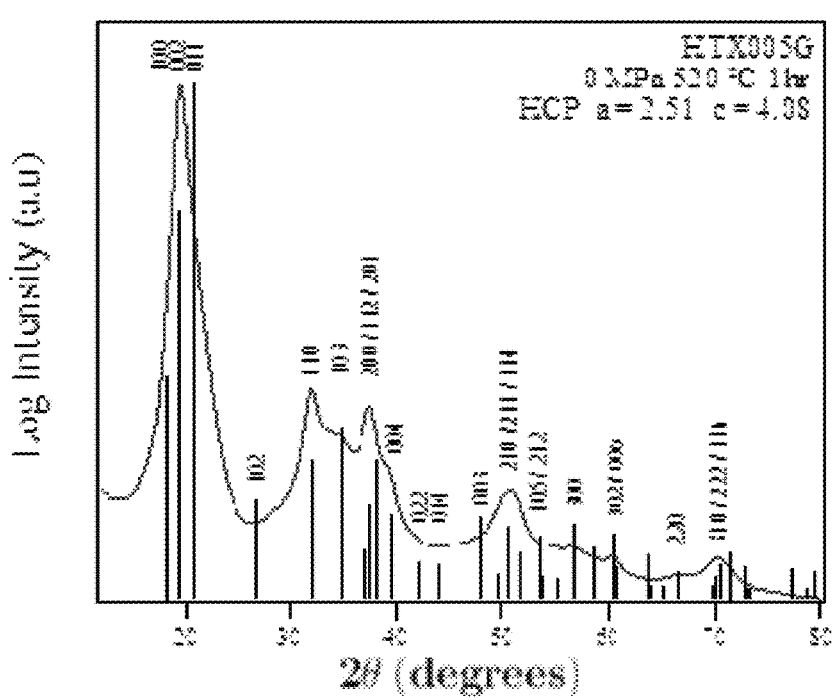
FIG. 10 is a diagram of x-ray diffraction pattern of HTX005g annealed for 1 hour at 520° Celsius.

Referring to FIG. 10, diagram 200 illustrates an x-ray diffraction pattern of $Co_{75.4}Fe_{2.3}Mn_{2.3}Nb_4B_{14}Si_2$ annealed for 1 hr at 520° Celsius. This pattern shows structure data where the indexed notation shows planar locations corresponding to the hcp lattice. The sharp peaks in FIG. 10 also appear at reflections satisfying H–K=3N in the hcp lattice and the additional higher order reflections measured by electron diffraction are not present. This is attributed to a higher sampling volume in the x-ray experiment compared to the electron experiment.

Figure 11:
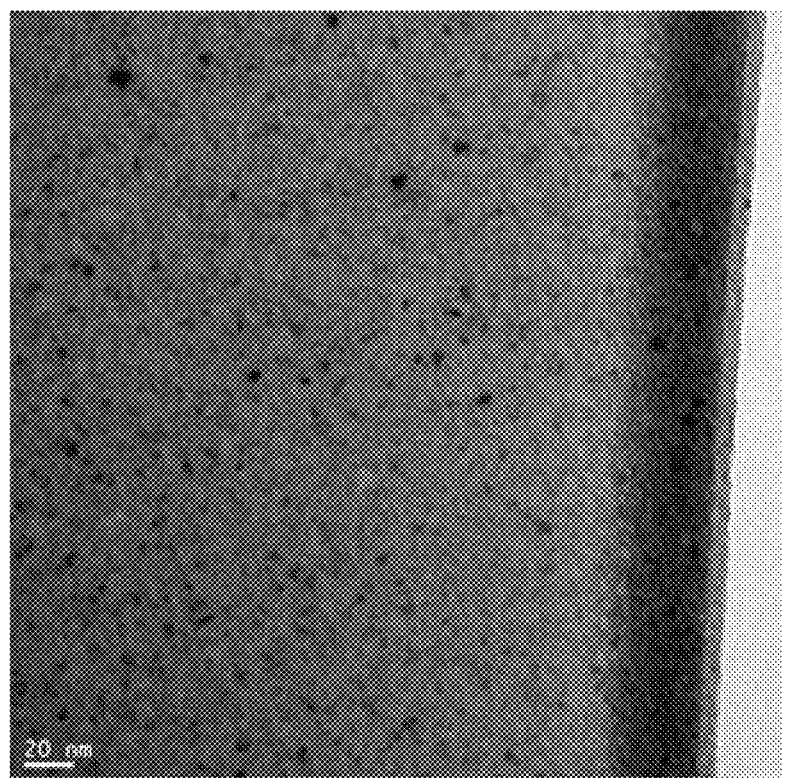
FIG. 11 is a diagram of a conventional transmission electron microscopy image of $Co_{75.4}Fe_{2.3}Mn_2.3Nb_4B_{14}Si_2$ annealed for 1 hour at 520° Celsius.
Figure 12:
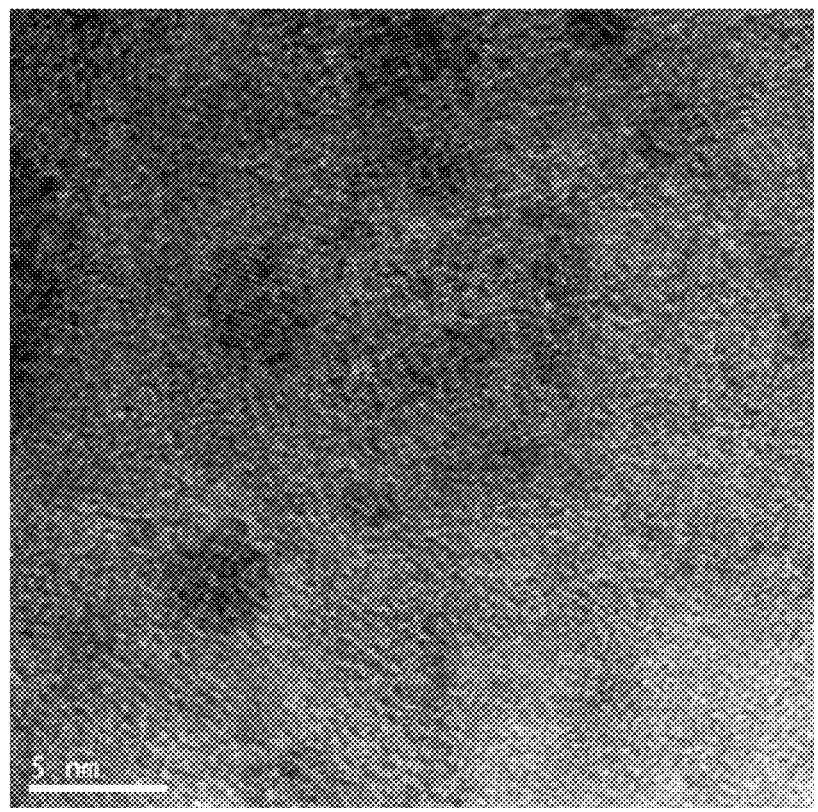
FIG. 12 is a diagram of a high resolution transmission electron microscopy image of $Co_{75.4}Fe_{2.3}Mn_2.3Nb_4B_{14}Si_2$ annealed for 1 hour at 520° Celsius.

Referring to FIG. 11, diagram 210 illustrates a conventional transmission electron microscopy image of $Co_{75.4}Fe_{2.3}Mn_{2.3}Nb_4B_{14}Si_2$ annealed for 1 hr at 520° Celsius. The fine grain structure is required for low coercivity and allows for higher temperature stability compared to amorphous alloys. The onset of crystallization occurs near 420° Celsius and the average grain size is below 10 nm.

Referring to FIG. 12, diagram 220 illustrates a high resolution transmission electron microcopy image of $Co_{75.4}Fe_{2.3}Mn_{2.3}Nb_4B_{14}Si_2$ annealed for 1 hr at 520° Celsius. FFT analysis of lattice fringing confirms the close packed structure and areas containing stacking faults are evident.

The magnetic material is formed by rapid solidification from pre-alloyed ingots with compositions based on Co, containing 30 atomic % or less Fe and/or Ni, and 50 atomic % or less of one or more metals selected from the group comprising boron (B), carbon (C), phosphorous (P), silicon (Si), chromium (Cr), tantalum (Ta), niobium (Nb), vanadium (V), copper (Cu), aluminum (Al), molybdenum (Mo), manganese (Mn), tungsten (W), and zirconium (Zr).

The amorphous precursor undergoes strain annealing, a processing technique in which a stress field is applied to the ribbon at a desired temperature for a desired duration of time. The product of strain annealing is a nanocomposite consisting of crystallite particles of nanometer size scale embedded in the residual amorphous matrix. The strain annealed nanocomposite ribbon exhibits magnetic anisotropy.

The induced anisotropy is tuned by varying the applied stress during the annealing process and the anisotropy response is linear with stress to a threshold value that varies for each alloy. In some alloys, stresses may be applied up to 1 GPa without material failure resulting in low permeabilities for Co-rich compositions with negative magnetostrictions.

Low permeability level (100 to 15) combined with flat B-H loop and low watt loss allows application of the claimed material in various inductors and energy storage devices instead of powder cores or gapped cores. In contrast with powder cores, the tape wound cores made of the Co-rich alloys can be wound practically of any size, whereas powder core size usually is not more than about 6-8 in., and limited by required compaction pressure and strength of die tool steel. Gapped cores have significant fringing flux that causes additional watt loss, heating of adjacent metallic parts, and EMI/RFI problems, in contrast with gapless tape wound cores made of strain annealed claimed Co-rich alloys.

Surface roughness in the sensing element leads to anomalous losses that degrade sensor performance. Coating of a conductive material to reduce surface roughness of the ribbon reduces stray fields caused by surface roughness and improves sensor performance.

The field sensitivity peak for GMI sensors occurs when the external field approaches the level of the induced anisotropy field. Larger anisotropy fields in the strain annealed Co-based alloys described above allow for wider and tunable ranges of sensor operation in GMI sensors that employ these materials as sensing elements in ribbon or wire form. Similarly, tunable permeability in inductor cores is advantageous to tailor a magnetic material to a particular application. Low permeability cores exhibit significant advantages for applications requiring high power transformation and large stored energies. The larger anisotropy fields in the strain annealed alloys described above allow for lower and tunable permeabilities for such applications.

Figure 13:
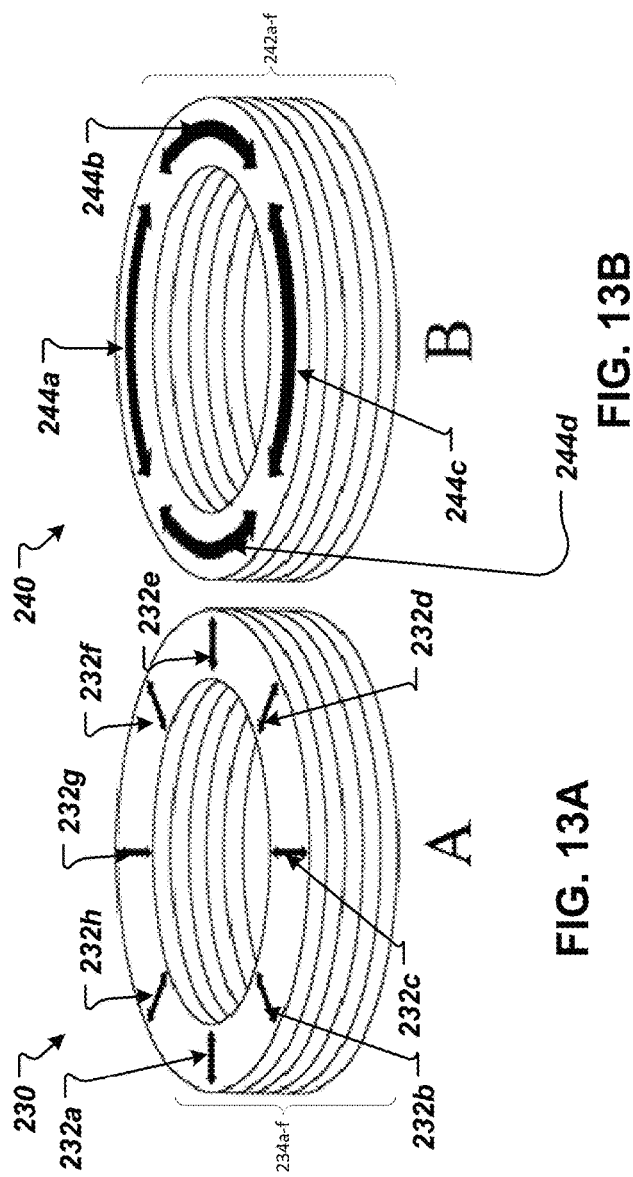
FIGS. 13A-B are diagrams of ring cores formed by stacked annular discs with radial and circumferential anisotropy.

Referring to FIG. 13A, diagram 230 illustrates that radial anisotropies 232a-232h in stamped discs 234a-f result from combined hoop and radial stresses formed during annealing and/or cooling. The stress state created during annealing may be influenced by centripetal forces induced by rotating annular discs in a furnace. The choice of composition and processing method depends on the geometry of the desired component. Alloys that develop an easy axis perpendicular to the stress axis, such as $Co_{75.4}Fe_{2.3}Mn_{2.3}Nb_4B_{14}Si_2$, result in anisotropy shown in FIG. 13A from such a treatment whereas alloys that develop an easy axis parallel to the stress axis, such as $Co_{77.2}Fe_{1.4}Mn_{1.4}Nb_4B_{14}Si_2$, would develop anisotropy as shown in FIG. 13B. The stamping of discs as in FIG. 13A with radial indentations confine eddy currents in a manner analogous to laser scribing of Silicon steels.

Referring to FIG. 13B, diagram 240 illustrates that circumferential anisotropies 244a-244d in stamped discs 242a-f result from combined hoop and radial stresses formed during annealing and/or cooling, where the sign of the magnetostriction coefficient is changed. The choice of composition and processing method depends on the geometry of the desired component.

In an example, a material includes cobalt (Co), 30 atomic % or less of Iron (Fe) or Nickel (Ni) and 50 atomic % or less of one or more metals selected from the group comprising boron (B), carbon (C), phosphorous (P), silicon (Si), chromium (Cr), tantalum (Ta), niobium (Nb), vanadium (V), copper (Cu), aluminum (Al), molybdenum (Mo), manganese (Mn), tungsten (W), and zirconium (Zr). In this example, the material has a composite structure with crystalline grains less than approximately 50 nanometers in average diameter embedded within an amorphous matrix. Compared to the nominal composition, the amorphous matrix that surrounds the grains becomes enriched in early transition metals and limits further grain growth during crystallization. The material is formed through a thermo-mechanical process that results in an amorphous precursor material and includes at least one mechanical operation and at least one thermal operation. The mechanical operation is also performed under elevated temperature conditions.

In this example, at least one thermal operation comprises a rapid solidification operation that includes formation of amorphous wires and/or ribbons by melt-spinning with and without glass coating, in-rotating water spinning, sputtering, and electrodeposition (see Phan, et al. Prog. Mat. Sci. 53 (2008). Raw materials used to create the desired composition should be of sufficient quality to limit impurities and can be in powder, ingot, or crushed ingot forms. Melt spinning is a technique used for rapid cooling of liquids. A wheel is cooled internally, usually by water or liquid nitrogen, and rotated. A thin stream of liquid is applied to the wheel either by jet casting a free stream or through a confined puddle formed between the nozzle and wheel surface and cooled, causing rapid solidification. This technique is used to develop materials that require extremely high cooling rates in order to form, such as metallic glasses. The cooling rates achievable by melt-spinning are on the order of $10^4$-$10^7$ kelvins per second (K/s).

In another example, at least one mechanical operation comprises application of a tensile strain along a longitudinal axis of a ribbon or a wire, during an elevated temperature annealing treatment above approximately 200° Celsius to control a permeability of the material. In this example, the applied tensile strain is less than approximately 350 megapascal (MPa) and an effective induced anisotropy is tunable up to 29 kJ/m³. In this example, a resulting anisotropy energy density per megapascal (MPa) of the applied tensile strain is greater than $$96 \frac{J/m^3}{MPa}.$$

This sensitivity to strain annealing attractive compared to $$10-25 \frac{J/m^3}{MPa}$$

in FeSiNbBCu nanocomposites. Additionally, FeSiNbBCu ribbons become brittle following crystallization and tend to fracture at low stresses (above 100 MPa), complicating strain annealing of these materials.

In another example, the material is included in a magnetic sensing material, an inductor, or a motor design. The fine grain structure in the nanocomposite averages the magnetocrystalline anisotropy between adjacent grains and leads to low coercivity. Low coercivity allows for low loss switching in inductive applications.

In another example, the material is annealed in a magnetic field with applied stress. Here, the material is supported in a magnetic field that is oriented in a desired direction while the sample is heated to through the chosen annealing profile. The ribbon can be wound into a core or unwound depending on the desired application.

In still another example, the material (from which the nanocomposite is made) is formed from an alloy that is dilute or substantially free of hafnium (Hf), zirconium (Zr), and titanium (Ti). These elements oxidize easily and greatly complicate planar flow casting where the casting atmosphere contains moderate amounts of oxygen. Typically, planar flow casting of compositions with Hf, Zr, and/or Ti require the entire casting process to be contained within a vacuum chamber which significantly increases production cost and complexity. In still another example, the alloy is an as-cast alloy, and an amorphous precursor of the as-cast alloy has a Curie temperature greater than approximately 600° Celsius. The Curie temperature of the amorphous matrix is typically lower than the Curie temperature of the crystalline grains. Operating temperatures approaching the amorphous phase Curie temperature result in increased coercivity and higher losses as the random anisotropy between grains breaks down. Generally, an as-cast material is material in ribbon or wire form that is mostly or wholly amorphous that is the precursor material to the annealing treatment necessary to form the nanocomposite.

In still another example, the nanocomposite with the tunable anisotropy is used as a magnetic field sensor in a sensing element, an inductor core, or a transformer. The tunable anisotropy affects the magnetic permeability of the nanocomposite, making the nanocomposite well suited for use as a magnetic field sensor. Permeability controls the skin depth, the saturation point of the material, and the dynamic magnetization mechanism and the ideal level depends on the application. Sensors that rely on Giant Magnetoimpedance (GMI) are sensitive to changes in skin depth over a limited frequency range and the ability to induce well defined anisotropy leads to high sensitivity at fields near the induced anisotropy field. The fluxgate magnetometer design uses a soft magnetic core that is alternately driven to saturation by a drive coil and is sensitive to the saturation point. When placed in an external field, the core saturates asymmetrically producing even harmonics proportional to the field strength according to Faraday's law. All sensor performance is dictated by the signal to noise level and Barkhausen noise arising from random domain wall movements is a significant noise source in magnetic sensors. Induced anisotropies control the magnetization mechanism by reducing domain wall motion and increasing magnetization changes by rotation. Because the ideal permeability for a magnetic field sensor depends upon the specific application and the type of device employed, the ability to tune induced anisotropies over a large range with resultant linear hysteresis loops allows for a broad range of applications and enhanced device compatibility.

In an example, the nanocomposite materials described here have increased ductility, relative to other soft magnetic nanocomposite materials. Generally, ductility is a solid material's ability to deform under tensile stress and ductility in ribbon form is generally determined by a simple bend test. Although the mechanistic origin of an enhanced mechanical ductility for high Co-containing nanocomposite alloys as compared to Fe-rich alloys has not yet been elucidated, it has been demonstrated empirically for a number of different alloy systems. In this example, the nanocomposite material is capable of being stamped for use in one or more of a motor stator and a rotor. The lower losses in the nanocomposite material allows for higher switching frequencies and speeds than is capable in Si-steel rotors. Suitable designs also may lead to higher efficiency. In this example, the nanocomposite material in the motor stator or in the rotor is capable of operation at approximately 200° Celsius. This is above the useful range of amorphous materials and is attributed to the higher Curie temperature and stability of the nanocomposite structure.

In an example, the material is capable of being planar flow cast without a protective vacuum. Planar flow casting within a protective vacuum chambers is required when the composition is highly sensitive to oxidation so the process is conducted in a carefully controlled atmosphere.

In still another example, the nanocomposite material is a wire in a sensing element that is included in a wirelessly interrogable device, such as a wirelessly interrogable acoustic sensor.

In still another example, the material in the wire form is capable of operation at temperatures above 150° Celsius. Amorphous materials tend to change structure and properties near this temperature and are not suited for long term, high temperature use at such elevated temperatures. Fe-rich nanocomposite alloys tend to have relatively low Curie temperatures of the amorphous phase which impart a strong temperature dependence of the response which is not desirable for a high temperature sensing device.

Figure 14:
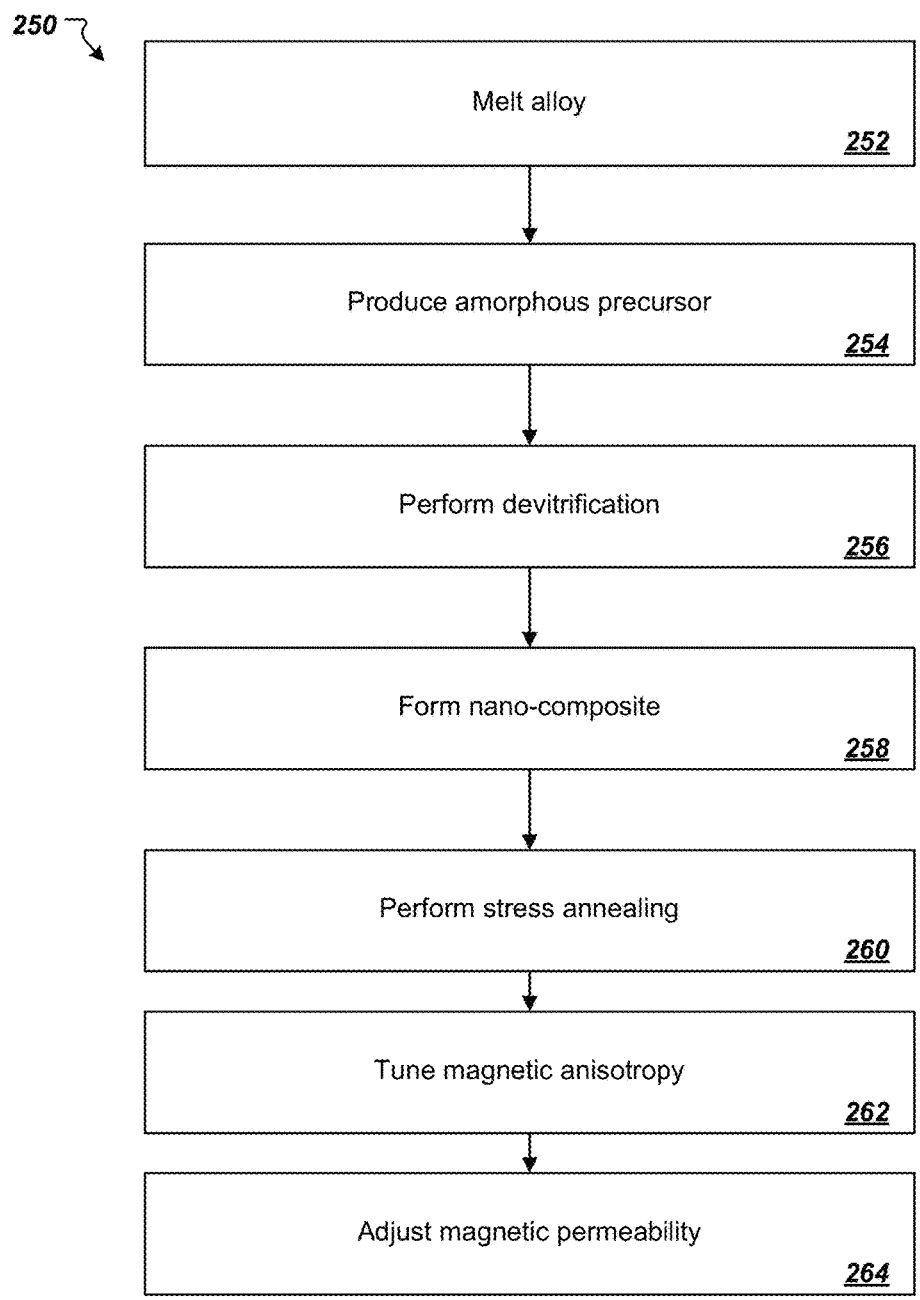
FIG. 14 is a diagram of a flow chart of a process for tuning anisotropies.

Referring to FIG. 14, one or more entities perform process 250 to tune anisotropy of a Co-based nanocomposite. For example, an entity could be a manufacturer of an inductor or a manufacture of the nanocomposite material. In operation, an alloy is melted (252). There are various types of alloys that may be used, including, e.g., iron, cobalt, nickel, and so forth. The melted alloy is solidified to produce (254) an amorphous precursor to a nanocomposite, with the amorphous precursor comprising a material without crystals. Various different types of solidification techniques may be used, including, e.g., casting onto a rotating copper wheel or drawing wire from a melt. Devitrification is performed (256) on the amorphous precursor, wherein the devitrification comprises a process of crystallization. The process also includes forming (258), based on the devitrification, the nanocomposite with nano-crystals.

In this example, the process also includes performing stress annealing (260) on the nanocomposite to modify the nano-crystals. There are various ways in which stress annealing is performed, e.g., pulling the material (in ribbon form) through a furnace, spreading the material out with heat and stress, applying lubricated thermal blocks to the ribbon, and other techniques for applying heat to the ribbon to promote crystallization in a particular geometry. In this example, the process includes tuning (262), based on an amount of stress annealing, a magnetic anisotropy of the nanocomposite. In this example, there is a linear relationship below a limiting threshold between the amount of stress annealing and the amount of induced magnetic anisotropy. That is, the tensile stress imparts the magnetic anisotropy, which in turn affects the magnetic permeability of the nanocomposite material. In this example, the process includes adjusting (264) the magnetic permeability of the nanocomposite material, e.g., to a level that is satisfactory for use of the nanocomposite material as a magnetic sensing element. Amorphous structures are metastable and the local stress and magnetic field present during crystallization determines the structure that results in the lowest energy following crystallization. Annealing without applied stress or a magnetic field results in a mainly isotropic structure. Annealing with a global stress and/or magnetic field results in pair ordering, preferred orientations of atoms/defects, and/or residual stress that remains at operating temperatures. All mechanisms can lead to magnetic anisotropy by non-uniform magnetocrystalline anisotropy and/or coupling to stress through non-zero magnetostriction. In another example, after formation of the amorphous precursor (by melt spinning, a powder method, or wire drawing), the material is devitrified under stress (e.g., via stress crystallization) with or without an applied field.

Other embodiments are within the scope and spirit of the description claims. Additionally, due to the nature of software, functions described above can be implemented using software, hardware, firmware, hardwiring, or combinations of any of these. Features implementing functions may also be physically located at various positions, including being distributed such that portions of functions are implemented at different physical locations. The use of the term "a" herein and throughout the application is not used in a limiting manner and therefore is not meant to exclude a multiple meaning or a "one or more" meaning for the term "a." Additionally, to the extent priority is claimed to a provisional patent application, it should be understood that the provisional patent application is not limiting but includes examples of how the techniques described herein may be implemented.

It will thus be seen that the objects set forth above, among those made apparent from the preceding description, are efficiently attained and, because certain changes may be made in carrying out the above method and in the construction(s) set forth without departing from the spirit and scope of the disclosure, it is intended that all matter contained in the above description and shown in the accompanying drawings shall be interpreted as illustrative and not in a limiting sense.

A number of exemplary implementations of the invention have been described. Nevertheless, it will be understood by one of ordinary skill in the art that various modifications may be made without departing from the spirit and scope of the invention.

What is claimed is:

1. A nanocomposite comprising cobalt (Co), 30 atomic % or less of Iron (Fe) or Nickel (Ni) and 50 atomic % or less of one or more metals comprising boron (B), carbon (C), phosphorous (P), silicon (Si), chromium (Cr), tantalum (Ta), niobium (Nb), vanadium (V), copper (Cu), aluminum (Al), molybdenum (Mo), manganese (Mn), tungsten (W), and zirconium (Zr);
wherein the nanocomposite further comprises:
a composite structure with crystalline grains less than approximately 50 nanometers in average diameter embedded within an amorphous matrix; and
a strain-annealed magnetic core formed through a thermo-mechanical process that includes at least one mechanical operation and at least one thermal operation, wherein the strain-annealed magnetic core comprises an induced anisotropy;
wherein the crystalline grains each comprise a close-packed crystal structure comprising a plurality of aligned faults in the close-packed crystal structure, with each of the faults aligned in a plane of the crystal structure, wherein the plurality of aligned faults in the close-packed crystal structure is configured to cause the induced anisotropy.

2. The nanocomposite of claim 1, wherein the at least one thermal operation comprises a rapid solidification operation that includes melt-spinning or wire-drawing from a liquid melt.

3. The nanocomposite of claim 1, further comprising an amorphous precursor electrodeposited or sputtered onto a substrate as a film with thickness less than 10 microns prior to annealing, wherein the substrate is pre-stressed prior to deposition/sputtering or stress applied after deposition/sputtering to induce the induced anisotropy.

4. The nanocomposite of claim 1, wherein the at least one mechanical operation comprises application of a tensile strain along a longitudinal axis of a ribbon or a wire, during an elevated temperature annealing treatment above approximately 420° Celsius to control a relative permeability of the nanocomposite.

5. The nanocomposite of claim 4, wherein a resulting anisotropy energy density per megapascal (MPa) of the applied tensile strain is greater than approximately $$100 \frac{J/m^3}{MPa}.$$

6. The nanocomposite of claim 4, wherein the nanocomposite is powdered by a milling operation.

7. The nanocomposite of claim 6, wherein the powder is annealed under temperature under stress and/or magnetic field.

8. The nanocomposite of claim 4, wherein the relative permeability is tunable from 10 to 1000 for use in low loss inductive applications.

9. The nanocomposite of claim 4, wherein a composition is chosen to induce square loops, and wherein the composition comprises $Co_{77.2}Fe_{1.4}Mn_{1.4}Nb_4B_{14}Si_2$.

10. The nanocomposite of claim 4, wherein resonant frequency is tunable as defined by $f_r = \sqrt{M_s H_k}$.

11. The nanocomposite of claim 1, wherein the at least one mechanical operation comprises an applied tensile strain less than approximately 200 megapascal (MPa) and wherein the nanocomposite further comprises an effective induced anisotropy that is tunable between 0 and approximately 20 kJ/m³.

12. The nanocomposite of claim 11, further comprising a magnetic permeability less than 50.

13. The nanocomposite of claim 1, wherein an effective induced anisotropy is tunable above approximately 30 kJ/m³.

14. The nanocomposite of claim 13, wherein an amorphous precursor of the alloy has a Curie temperature greater than approximately 500° Celsius.

15. The nanocomposite of claim 1, wherein the nanocomposite is included in a magnetic sensing material, an inductor, or a motor material.

16. The nanocomposite of claim 1, wherein the nanocomposite is annealed in a magnetic field applied at any angle with respect to the applied stress.

17. The nanocomposite of claim 1, wherein an as-cast material is thinned to reduce eddy currents by rolling and/or mechanical abrasion with or without applied temperature.

18. The nanocomposite of claim 1, wherein the nanocomposite is powdered by a milling operation.

19. The nanocomposite of claim 1, wherein an amorphous powder is produced by water atomization, plasma torch synthesis, or a rapid quench technique.

20. The nanocomposite of claim 1, wherein the nanocomposite is formed from an alloy, and wherein the alloy is dilute or substantially free of hafnium (Hf), zirconium (Zr), and titanium (Ti), wherein dilute corresponds to a total of less than 2 atomic % of all of Hf, Zr and Ti, and substantially free corresponds to less than 0.5 atomic % of a combination of Hf, Zr and Ti.

21. The nanocomposite of claim 1, wherein the nanocomposite is in wire form.

22. The nanocomposite of claim 1, where in to fracture ε in the nanocomposite is greater than 1%, as determined by $$\varepsilon = \frac{d}{D-d}$$

where d is the thickness of a material used in producing the nanocomposite and D is the diameter of a 180° bend.

23. The nanocomposite of claim 1, wherein the nanocomposite is capable of being stamped for use in one or more of a motor stator and a rotor.

24. The nanocomposite of claim 23, wherein the motor stator with the nanocomposite or the rotor with the nanocomposite is capable of operation above 200° Celsius.

25. The nanocomposite of claim 1, wherein a saturation induction is greater than 0.9 T.

26. The nanocomposite of claim 1, wherein the nanocomposite acts as an electromagnetic interference (EMI) shielding material, is capable of being crushed, milled, or powdered and compacted into a form with or without a binding agent, and wherein the compaction can be accomplished with or without an applied magnetic field to align particles in the nanocomposite.

27. The nanocomposite of claim 1, wherein one or more properties of the nanocomposite enable being planar flow casted without a protective vacuum.

28. The nanocomposite of claim 1, wherein the nanocomposite is a wire, and wherein the wire is a sensing element in a wirelessly interrogable device.

29. The nanocomposite of claim 1, wherein the nanocomposite in the wire form is configured to operate at temperatures above 150° Celsius.

30. The nanocomposite of claim 1, wherein the strain-annealed magnetic core has a magnetic permeability that is less than 1000.

31. The nanocomposite of claim 30, wherein the magnetic permeability is based on a stress applied to the strain-annealed magnetic core that is less than 100 MPa.

32. The nanocomposite of claim 1, wherein the induced anisotropy comprises an induced easy plane anisotropy.

33. The nanocomposite of claim 1, wherein the strain-annealed magnetic core has a magnetic permeability that is less than 100.

34. The nanocomposite of claim 1, wherein the induced anisotropy is stable at temperatures of at least 200 degrees Celsius in an applied longitudinal field.

35. The nanocomposite of claim 1, wherein the induced anisotropy is stable at temperatures less than an annealing temperature of the nanocomposite in an applied longitudinal field.

36. The nanocomposite of claim 1, wherein the induced anisotropy is based on the plurality of aligned faults comprising growth faults in the close-packed crystal structure of the nanocomposite.

37. The nanocomposite of claim 1, wherein the induced anisotropy is based on the plurality of aligned faults comprising stacked faulting in the close-packed crystal structure of the nanocomposite.

* * * * *